United States Patent [19]
Sin et al.

[11] Patent Number: 5,243,214
[45] Date of Patent: Sep. 7, 1993

[54] POWER INTEGRATED CIRCUIT WITH LATCH-UP PREVENTION

[75] Inventors: Johnny K. O. Sin, Hong Kong, Hong Kong; Barry M. Singer, New York; Satyendranath Mukherjee, Yorktown Heights, both of N.Y.

[73] Assignee: North American Philips Corp., New York, N.Y.

[21] Appl. No.: 868,746

[22] Filed: Apr. 14, 1992

[51] Int. Cl.$^5$ .............................................. H01L 27/14
[52] U.S. Cl. ................................... 257/372; 257/549; 257/547; 257/500; 257/373
[58] Field of Search ............... 257/500, 547, 549, 139, 257/140, 141, 170, 372, 373, 494, 495

[56] References Cited

U.S. PATENT DOCUMENTS

| | | | |
|---|---|---|---|
| 3,649,887 | 3/1972 | Keller et al. | 257/547 |
| 3,931,634 | 1/1976 | Knight | 257/547 |
| 4,170,501 | 10/1979 | Khajezadeh | 257/549 X |
| 4,466,011 | 8/1984 | Van Zanten | 357/48 |
| 4,647,956 | 3/1987 | Shrivastava et al. | 257/373 |
| 4,862,233 | 6/1987 | Matsushita et al. | 357/23.4 |
| 4,890,149 | 12/1989 | Bertotti et al. | 257/547 |
| 4,952,998 | 4/1989 | Ludikhuize | 357/42 |

FOREIGN PATENT DOCUMENTS 62-12151 1/1987 Japan .

OTHER PUBLICATIONS

Troutman, "Epitaxial Layer Enhancement of N-Well Guard Rings for CMOS Circuit," *IEEE Electron Device Letters*, vol. EDL-4, No. 12, Dec. 1983, pp. 438-440.

Primary Examiner—William Mintel
Attorney, Agent, or Firm—Steven R. Biren

[57] ABSTRACT

A power integrated circuit includes a substrate with an overlying epitaxial surface layer of opposite conductivity type. A semiconductor power device, such as a high-power diode or lateral MOS transistor, is located in the epitaxial layer and forms a p-n junction diode with the substrate. The power integrated circuit also includes a separate semiconductor well region in the epitaxial layer, in which one or more low-power semiconductor circuit elements are formed. In order to minimize the problem of latch up in the low-power circuit elements due to the injection of minority carriers from the substrate, the power integrated circuit is provided with a collector region and an isolation region between the power device and the well region having the low-power circuit elements.

8 Claims, 2 Drawing Sheets

POWER INTEGRATED CIRCUIT WITH LATCH-UP PREVENTION

BACKGROUND OF THE INVENTION

The invention is in the field of power integrated circuit (PIC) devices, and relates more specifically to the prevention of latch-up in low-power circuit elements provided on the same integrated circuit as a power device.

In such PIC devices, a free-wheeling diode is typically used in conjunction with the power device in inductive load power switching and other applications. This free-wheeling diode is typically a separate, external diode connected to prevent forward current from flowing through the power device in such a manner as to inject minority carriers into the substrate. It would be desirable, however, to eliminate the external diode by having the body diode formed by adjacent regions of opposite conductivity types in the power device serve as the free-wheeling diode. This configuration not only eliminates an external part, but also reduces the pin count when used in a PIC device.

However, in PIC devices such as those built using a bulk CMOS process, when the body diode is turned on, minority carriers will be injected into the substrate. Since the low power circuits are fabricated in a semiconductor well which can form the collector of a parasitic transistor, minority carriers injected by the body diode will be collected by the well, resulting in latch-up and failure of the low-power circuits. Thus, in order to use the body diode in a PIC device as a free-wheeling diode, a technique is needed to prevent the interaction between the body diode and the low-power circuit elements fabricated in the semiconductor well. Although various prior-art techniques for preventing latch-up and/or absorbing minority carriers are known (see, for example, U.S. Pat. Nos. 4,952,998 and 4,862,233, Japanese Kokai 62-12151, and *Epitaxial Layer Enhancement of n-Well Guard Rings for CMOS Circuits*, IEEE Electron Device Letters, Vol. Edl-4, No. 12, pp. 438-440, December, 1983), none of these prior-art techniques are completely satisfactory for preventing latch-up when using the body diode of a power device as a free-wheeling diode in a power integrated circuit.

SUMMARY OF THE INVENTION

It is therefore an object of the present invention to enable the use of the body diode of a power device as a free-wheeling diode in a power integrated circuit while preventing latch-up in low-power circuitry fabricated in an adjacent semiconductor well in the same device.

A further object of the invention is to provide a latch-up immune PIC device which is simple in configuration and which can be easily and inexpensively fabricated using conventional processing techniques.

In accordance with the invention, these objects are achieved by an improved power integrated circuit configuration of the type having a semiconductor substrate of a first conductivity type, a semiconductor epitaxial surface layer of a second conductivity type opposite to that of the first on the substrate, a semiconductor power device at least partially in the epitaxial surface layer and forming a p-n junction diode with the substrate, and a semiconductor well region of the second conductivity type in the epitaxial layer and spaced apart from the power device, with the well region having at least one low-power semiconductor circuit element. The improvement of the invention is achieved by employing a semiconductor collector region of the second conductivity type in the epitaxial surface layer, having a higher doping level than that of the epitaxial surface layer, and located adjacent to but spaced apart from the semiconductor power device, in combination with a semiconductor isolation region of the first conductivity type in the epitaxial surface layer, having a higher doping level than that of the substrate, and located between, and spaced apart from, the collector region and the well region of the device.

By providing a PIC device with both a collector region and an isolation region in accordance with the invention, latch-up resulting from injection of minority charge carriers into the substrate is substantially prevented in a PIC device utilizing the body diode as the free-wheeling diode. In this manner, a simple, easily-fabricated, latch-up immune PIC device with an integrated free-wheeling diode is obtained.

It should be noted that the Figures are not drawn to scale, and in particular the vertical dimensions are exaggerate for improved clarity. Additionally, semiconductor regions of the same conductivity type are generally shown hatched in the same direction.

DESCRIPTION OF THE PREFERRED EMBODIMENTS

Figure 1:
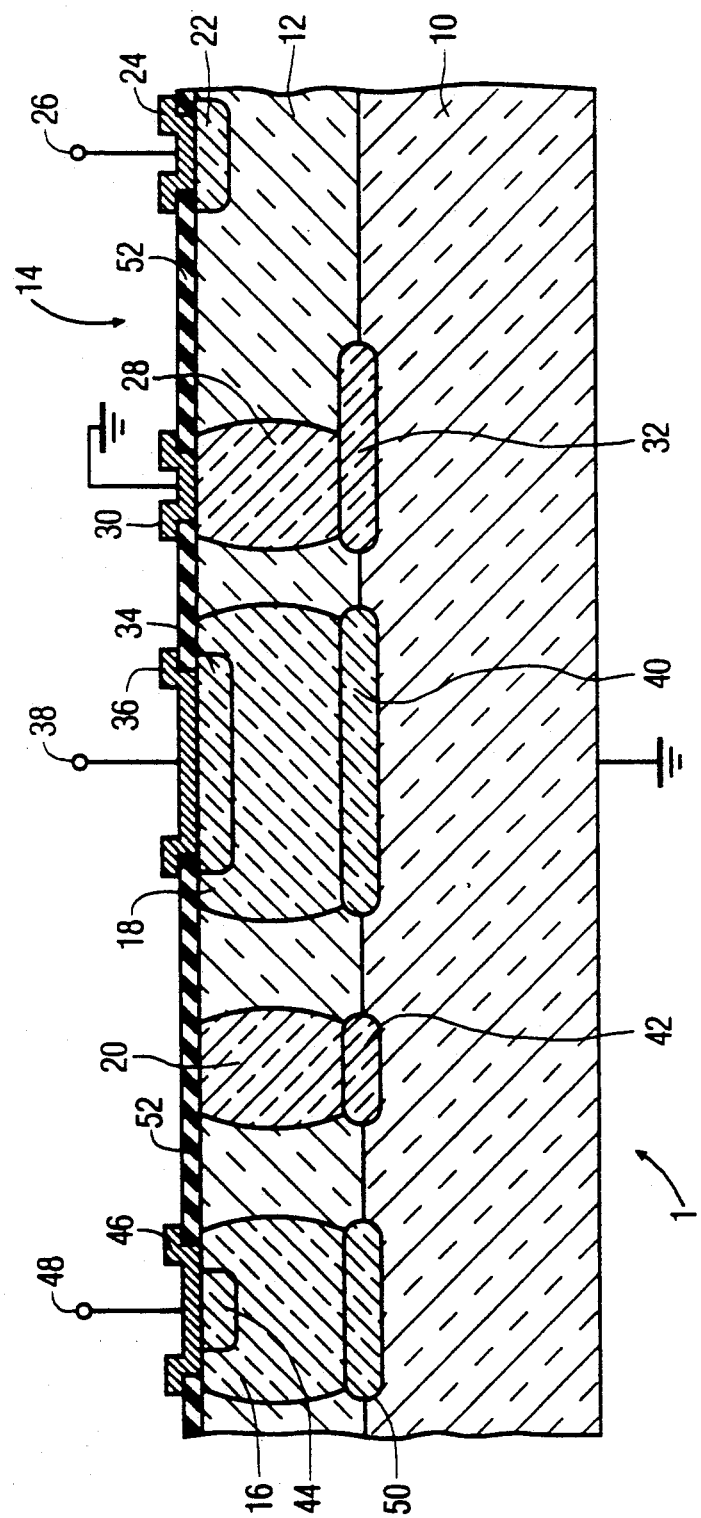
FIG. 1 is a cross-sectional view of a PIC device in accordance with a first embodiment of the invention.

FIG. 1 of the drawing shows a power integrated circuit (PIC) device 1 having a semiconductor substrate 10 of a first conductivity type, here p-type, with a doping concentration level of about $10^{14}$ atoms/cm$^3$. A semiconductor epitaxial surface layer 12 of a second conductivity type opposite to that of the first, here n-type, with a doping concentration level of about $10^{14}$ atoms/cm$^3$ and a thickness typically in the range of about 5-20 microns, is provided on the substrate. The PIC device further includes a semiconductor power device 14 at least partly in the epitaxial surface layer 12, and a semiconductor well region 16 of n-type conductivity having at least one low-power semiconductor circuit element represented in simplified form in FIG. 1 by n-type region 44. Semiconductor power device 14 is represented in FIG. 1 in simplified form as a diode including n-type region 22, the n-type epitaxial layer 12, a buried p-type region 32 and p-type region 28. It will be understood that this is merely a symbolic depiction of a power device, used for purposes of clarity and simplicity in describing the invention. In practice, semiconductor power device 14 may be any one of a number of different power devices, such as an LDMOS transistor, an LIGBT or a thyristor. In practice, n-type semiconductor well region 16 will typically contain a plurality of low-power semiconductor circuit elements, such as CMOS circuit elements. Again, for clarity and simplicity, only a single semiconductor region 44, which might typically be a point at which the CMOS circuitry is externally connected to a voltage supply, is shown.

In accordance with the invention, the PIC further includes a semiconductor collector region 18 of n-type conductivity located adjacent to power device 14, and a p-type semiconductor isolation region 20 located between the semiconductor collector region 18 and semiconductor well region 16. It should also be noted that the power integrated circuit shown in FIG. 1 may be fabricated using various geometries. Thus, for example, the device may be configured in a symmetrical fashion around region 22, with region 28, collector region 18, isolation region 20 and semiconductor well region 16 forming concentric annular regions about central region 22 when viewed from above.

Figure 2:
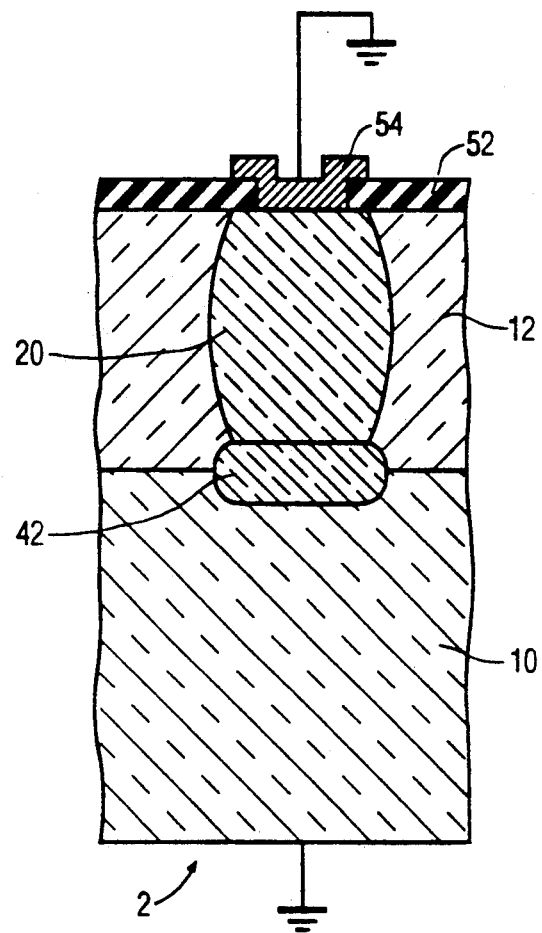
FIG. 2 is a cross-sectional view of a portion of a device such as that shown in FIG. 1, illustrating a second embodiment of the semiconductor isolation region of the PIC device.

Keeping in mind the foregoing overview description, the construction of the device is shown in FIGS. 1 and 2 will now be described in further detail, followed by a description of how the invention operates to prevent latch-up in the PIC device.

The semiconductor power device 14, shown in FIG. 1 as a lateral diode for simplicity, includes a surface region 22 of n-type material having a relatively high doping level, typically on the order of $10^{19}$–$10^{20}$ atoms/cm$^3$ and a thickness of between about 0.3–1.0 microns. Region 22 is connected by surface metallization 24 to a schematically-shown electrode 26. The diode structure of power device 14 also includes p-type region 28, which has a relatively high doping level of about $10^{17}$–$10^{18}$ atoms/cm$^3$ and which extends down to p-type buried region 32, located at the intersection between epitaxial surface layer 12 and substrate 10 and having a doping level of about $3.0$–$5.0\times10^{15}$ atoms/cm$^3$ and a thickness of between about 3–5 microns. Region 28, which forms the anode of the power diode, is provided with surface metallization 30, in this embodiment shown schematically as connected to ground. In a conventional manner, the surface portions of epitaxial layer 12 which do not have metallization are covered with an insulating layer such as oxide layer 52.

Located adjacent to region 28 of the power device is semiconductor collector region 18, which is an n-type region having a doping concentration level of about $3.0$–$5.0\times10^{15}$ atoms/cm$^3$ and extends from the upper surface of epitaxial layer 12 down to a collector buried region 40, which is located at the intersection of the substrate and the epitaxial layer, is of n-type conductivity with a doping level of about $10^{17}$–$10^{18}$ atoms/cm$^3$ and has a thickness of about 2–4 microns. The structure of the collector region is completed by a semiconductor surface contact layer 34, which is an n-type layer having approximately the same doping concentration level and thickness as that of region 22. An electrical connection to the contact layer 34 is provided by metallization 36 and schematically-shown electrode 38.

The p-type semiconductor isolation region 20 is provided adjacent the collector region 18 and has approximately the same doping concentration level and thickness as region 28. Similarly, a p-type isolation buried region 42, having approximately the same doping concentration level and thickness as collector buried region 32, is provided beneath isolation region 20 at the intersection between the epitaxial layer and the substrate.

The final element of the PIC device shown in FIG. 1 is the n-type semiconductor well region 16, which has approximately the same doping level and vertical extent as collector region 18, with an underlying buried layer 50, which has a doping level, thickness and location analogous to that of collector buried region 40. As noted above, this well region will in practice contain a plurality of low-power semiconductor circuit elements, shown here in symbolic and simplified form as a surface contact region 44 having approximately the same thickness and doping level as surface contact layer 34 of the collector region. Contact region 44 is provided with metallization 46 and symbolically-shown electrode 48.

FIG. 2 shows a cross-sectional view of a portion of a device such as that shown in FIG. 1, illustrating a second embodiment of the semiconductor isolation region 20. In this embodiment, a PIC device 2, otherwise identical to device 1 shown in FIG. 1, is provided with an additional metallization 54 extending through oxide layer 52 to contact the upper surface of semiconductor isolation region 20. In the embodiment shown, metallization 54 is connected to ground, as is the substrate 10 in both embodiments. The remaining portions of FIG. 2 show surrounding areas of the device, which are identical to the like-numbered parts in FIG. 1.

As explained above, PIC devices using an integrated body diode as a free-wheeling diode will typically result in undesirable minority carrier injection into the substrate, and possible latch-up and failure of the low-power circuits. The present invention serves to overcome this problem by providing a collection region in combination with an isolation region to prevent latch-up caused by minority carrier flow in the substrate. For illustration, if a negative voltage is applied to electrode 26, current will flow from electrode 26 through region 22, epitaxial layer 12, region 28, and then through metallization 30 to ground. However, when this power diode (or other power device 14) is conducting, undesired minority carrier injection into the substrate 10 will also occur. In an unprotected prior-art device, or even in a device containing only a collector region, some of these minority carriers will flow through the substrate to reach well 16, since in operation electrode 48 will typically be connected to a positive voltage and will attract minority carriers (here electrons) from the substrate. This leakage current, caused by minority carrier injection into the substrate, can result in latch-up of the low-power circuit elements contained within well 16, and in the extreme case, can result in permanent damage to the device.

In order to reduce this damaging leakage current, the collector region 18 is provided between the power device 14 and the circuit-containing well region 16. In prior-art devices, not having isolation region 20, the collector region, if provided, is typically connected to the positive power supply voltage. However, this results in an undesirably large current flow through the collector region, with its attendant disadvantages, while still not preventing some current from flowing through the substrate, under the collector region and into the well region containing the low-power circuit elements.

This problem is overcome with the present invention by using the isolation region 20 in combination with the collector region 18 to reduce undesired leakage current to a very low level, thus avoiding latch-up and damage to the low-power circuit elements. It is believed that isolation region 20 substantially improves device performance by reflecting electrons that pass under the collector back toward the collector, rather than permitting them to continue on to the well region 16, where the resulting current flow might cause malfunction or damage.

Furthermore, by using the collector region and isolation region in combination, the collector region can be connected to a voltage lower than the positive supply voltage, and even to ground, while still substantially reducing leakage current into the well region. With a reduced collector voltage, undesired current flow through the collector will be reduced, and if the collector voltage is reduced to zero, the additional advantage of greater circuit simplicity as well as reduced current flow is achieved. Thus, for example, even with collector electrode 38 grounded, the configuration of the present invention will reduce the leakage current into the well region by between about 4 and 7 orders of magnitude below the current flowing into electrode 26. The desired degree of leakage current reduction, within the above-mentioned range, can be achieved by appropriately selecting the width (i.e. the horizontal dimension in FIG. 1) of the collector region 18 and its associated collector buried region 40. For example, a relatively compact device, with a leakage current reduction of about 4 orders of magnitude, can be obtained with a collector region width of about 50 microns, while a somewhat larger device, having a collector region width of about 150 microns, will provide a leakage current reduction of about 7 orders of magnitude.

Finally, device performance can be further enhanced by using the alternate embodiment shown in FIG. 2. In this embodiment, the isolation region 20 is connected directly to ground by metallization 54 at its surface, rather than being connected indirectly to ground through the relatively high resistance of the substrate 10. The result is a further reduction in leakage current, at the expense of somewhat greater device complexity.

While the invention has been particularly shown and described with reference to several preferred embodiments thereof, it will be understood by those skilled in the art that various changes in form and detail may be made without departing from the spirit and scope of the invention.

We claim:

1. A power integrated circuit comprising a semiconductor substrate of a first conductivity type, a semiconductor epitaxial surface layer of a second conductivity type opposite to that of the first on said substrate, a semiconductor power device at least partly in said epitaxial surface layer and forming a p n junction diode with said substrate, and a semiconductor well region of said second conductivity type in said epitaxial layer and spaced apart from said power device, said well region having at least one low-power semiconductor circuit element, wherein the improvement comprises:
 a semiconductor collector region of said second conductivity type in said epitaxial surface layer, having a higher doping level than that of said epitaxial surface layer, and located adjacent to, but spaced apart from, said semiconductor power device; and
 a semiconductor isolation region of said first conductivity type in said epitaxial surface layer, having a higher doping level than that of said substrate, and located between, and spaced apart from, said collector region and said well region.

2. A power integrated circuit as claimed in claim 1, wherein said collector region comprises a semiconductor surface contact layer of said second conductivity type and having a higher doping level than that of said collector region.

3. A power integrated circuit as in claim 2, further comprising a collector buried region of said second conductivity type and having a higher doping level than that of said collector region, located beneath said collector region and at an intersection of said epitaxial surface layer and said substrate.

4. A power integrated circuit as in claim 3, further comprising an isolation buried region of said first conductivity type and having a higher doping level than that of said isolation region, located beneath said isolation region and at the intersection of said epitaxial surface layer and said substrate.

5. A power integrated circuit as in claim 3, wherein said collector region and said collector buried region are each between about 50 microns and 150 microns wide.

6. A power integrated circuit as in claim 2, further comprising means for connecting said surface contact layer of said collector region, during operation, to a voltage source of between about zero volts and a supply voltage of said semiconductor circuit element.

7. A power integrated circuit as in claim 6, wherein said voltage source is substantially zero volts.

8. A power integrated circuit as in claim 6, further comprising means for directly connecting said isolation region at its surface, during operation, to a same potential as that of said substrate.

* * * * *